(12) United States Patent
Cavallucci et al.

(10) Patent No.: US 8,193,498 B2
(45) Date of Patent: Jun. 5, 2012

(54) METHOD AND DEVICE FOR OPTICALLY DETERMINING THE POSITION OF AN OBJECT

(75) Inventors: Gilles Cavallucci, Nimes (FR); Philippe Plantier, Nimes (FR)

(73) Assignee: H2I Technologies, Nimes (FR)

( * ) Notice: Subject to any disclaimer, the term of this patent is extended or adjusted under 35 U.S.C. 154(b) by 565 days.

(21) Appl. No.: 12/225,734

(22) PCT Filed: Mar. 30, 2007

(86) PCT No.: PCT/FR2007/051048
§ 371 (c)(1),
(2), (4) Date: Sep. 18, 2009

(87) PCT Pub. No.: WO2007/113446
PCT Pub. Date: Oct. 11, 2007

(65) Prior Publication Data
US 2010/0038545 A1 Feb. 18, 2010

(30) Foreign Application Priority Data

Mar. 31, 2006 (FR) ...................................... 06 02792

(51) Int. Cl.
*G01B 11/00* (2006.01)
(52) U.S. Cl. ..................................... 250/336.1; 356/614

(58) Field of Classification Search ............... 250/336.1, 250/338.1, 339.11, 372; 356/614
See application file for complete search history.

(56) References Cited

U.S. PATENT DOCUMENTS

| 5,212,392 | A | 5/1993 | Berkcan et al. |
| 2003/0006973 | A1 | 1/2003 | Omura et al. |
| 2005/0171725 | A1 | 8/2005 | Vogler et al. |
| 2006/0152740 | A1* | 7/2006 | Cavallucci et al. ........... 356/614 |

FOREIGN PATENT DOCUMENTS

| EP | 0 851 211 | 7/1998 |
| FR | 2 826 443 | 12/2002 |
| FR | 2 859 277 | 3/2005 |

* cited by examiner

*Primary Examiner* — Mark R Gaworecki
(74) *Attorney, Agent, or Firm* — Clark & Brody (57) ABSTRACT

The invention relates to a method and a device for optically determining the position of an object in a particular area of a substantially plane surface. According to the invention at least one directional single-point emitter associated with at least two directional single-point light receivers covering the particular area are disposed near said particular area, each light emitter and receiver having an axis substantially parallel to the particular area and on which maximum emission, respectively maximum sensing angle, is observed, so that the axes of the receivers intersect the axis of the emitter at different points. The light emitter is energized and the position of the object on the axis of the emitter is determined as a function of a comparison of the light signals reflected and diffused by the object toward each of the two light receivers.

29 Claims, 5 Drawing Sheets

METHOD AND DEVICE FOR OPTICALLY DETERMINING THE POSITION OF AN OBJECT

BACKGROUND OF THE INVENTION

The present invention relates to the general field of optical detectors for determining the position of an object on a substantially plane surface. The object can in particular have various geometrical and/or optical characteristics, in particular various shapes and/or colors.

The invention can be applied in particular in the field of data entry, for example alphanumeric data entry. The invention therefore finds an application in the production of keyboards or similar devices for manual data entry, such as computers, telephones, personal digital assistants, etc.

Various optical devices are known for detecting the position of an object with a view to entering data.

One standard technique for position determination in two dimensions produces a grid of emitter/receiver pairs and determines the position of the object from which beams are cut. Relying on transmission, that kind of technique offers little flexibility and requires the use of numerous components.

Another solution, described in the document FR 2 826 443, is to place emitters and receivers on two facing opposite sides of a surface. That reduces the number of components but it is still necessary to provide connection members between the two opposite sides of the active surface, which is still limited by the geometry of the device.

The document FR 2 859 277 describes a method of determining the position of an object based on reflection by the object of light emitted by one or more emitters, the reflected light being detected by one or more receivers and then analyzed to determine the position of the object.

The emitters and receivers alternate in the same row, which makes the active surface less dependent on the geometry of the device. Among other things, this makes integration very flexible. The position of an object on a substantially plane surface can then be determined to enable an operator to enter data in a similar way to entry via a keyboard.

Devices using that method enable data to be entered but they are often lacking in flexibility and accuracy.

This is reflected either in requiring many attempts to enter information or in the device having a relatively long response time. Overall, it has been found that that kind of method regularly causes a loss of time that prejudices the application of the method in fields where entry time is an important parameter.

OBJECT AND SUMMARY OF THE INVENTION

A principal object of the present invention is therefore to alleviate such problems by proposing to dispose in the vicinity of said particular area at least one directional single-point emitter associated with at least two directional single-point light receivers covering the particular area, each light emitter and receiver having an axis substantially parallel to the particular area on which maximum emission, respectively maximum sensing angle, is observed, so that the axes of the receivers intersect the axis of the emitter at different points; then energizing the light emitter; and finally determining the position of the object on the axis of the emitter as a function of a comparison of the light signals reflected and diffused by the object toward each of the two light receivers.

With this kind of method, positioning the emitters and receivers so that their axes intersect at a non-zero angle achieves better accuracy than if the receivers and emitters were to have parallel axes. Two different signal measurements are obtained for each position of an object on the axis of the emitter, whereas if the axes of the receivers and emitters were parallel, there would be only one measurement, or at best two similar measurements produced by receivers disposed symmetrically relative to the axis of the emitter. The invention primarily uses diffusion of light by an object, the diffused light being received by receivers that are off the axis of the emitter.

The invention also has the advantage that it can be implemented using emitters of non-coherent light that are of low cost. Furthermore, using directional single-point receivers and emitters, for example a directional diode, means that the invention does not use costly and potentially fragile optical devices such as lenses or mirrors. The optical components used, such as photodiodes or phototransistors, are simple and easy to integrate onto a printed circuit.

The resulting reliability enables an object to be detected even if its shape and/or its color are very different from those expected.

The invention exploits the directional character of the emitter and of the receivers. If non-directional receivers were used, the signals received by the two receivers would depend simultaneously on the shape, the optical characteristics, and the distance of the object, with the result that it would be impossible to extract reliable distance information from them.

The emitters and receivers are advantageously disposed on the same side of the particular area.

In one embodiment, the comparison consists in calculating a ratio between the light signals received by each of the receivers when illuminated by the associated emitter.

One particularly advantageous embodiment of the method comprises the steps of disposing a set of directional spot, or single-point, emitters in the vicinity of said particular area and a set of directional spot, or single-point receivers, each emitter being associated with at least two receivers so that the axes of those receivers intersect the axis of the emitter at different points, energizing the light emitters successively, identifying the optimum emitter for which maximum light signals reflected and diffused by the object are received by at least one receiver, and determining the position of the object on the axis of the optimum emitter as a function of a comparison of the light signals reflected and diffused by the object toward the two light receivers associated with the optimum emitter.

According to one particular feature of the invention, the receiver for identifying the optimum emitter is chosen as a function of the emitter concerned.

The receiver for identifying the optimum emitter is advantageously a receiver associated with the emitter concerned.

According to another particular feature of the invention, the method includes the step of doubling the number of receivers and disposing them symmetrically relative to the axes of the emitters.

According to one variant of the invention, the method includes the following steps: disposing in the vicinity of said particular area at least two directional single-point emitters associated with one directional single-point light receiver covering the particular area, each light emitter and receiver having an axis substantially parallel to the particular area in which maximum emission, respectively maximum sensing angle, is observed, so that the axes of the emitters intersect the axis of the receiver at different points, energizing the light emitters successively, and determining the position of the object on the axis of the receiver as a function of a comparison of the light signals reflected and diffused by the object toward the light receiver on the successive energizing of the emitters.

An advantageous embodiment of the method includes the steps of disposing a set of directional single-point emitters in the vicinity of said particular area and a set of directional single-point receivers, each receiver being associated with at least two emitters so that the axes of those emitters intersect the axis of the receiver at different points; energizing the light emitters successively; identifying the optimum receiver for which maximum light signals reflected and diffused by the object are received by that receiver on energizing at least one of the emitters; determining the position of the object on the axis of the optimum receiver as a function of a comparison of the light signals reflected and diffused by the object toward the optimum receiver on the successive energizing of the associated emitters.

The particular features referred to above are equally applicable to this variant if the term receiver is substituted for the term emitter and vice-versa.

In one advantageous embodiment, emitter(s) and receivers are disposed in a single row.

According to one feature of the invention, the emitter(s) emit(s) non-coherent light.

In particular, the wavelength of the emitted light is chosen in one of the following ranges of wavelengths: UV, visible, and infrared.

In one embodiment the particular area is defined by a set of vicinities of points of intersection of the axes.

The particular area advantageously includes a set of elementary areas each associated with a given function so that any position of the object in an elementary area activates the function associated with that elementary area.

The invention also relates to an optical device for determining the position of an object in a particular area of a substantially plane surface, including, in the vicinity of said particular area, at least one directional single-point emitter associated with at least two directional single-point light receivers covering the particular area, each light emitter and receiver having an axis substantially parallel to the particular area on which maximum emission, respectively maximum sensing angle, is observed, so that the axes of the receivers intersect the axis of the emitter at different points, control means for energizing the light emitter, and processing means for determining the position of the object on the axis of the emitter as a function of a comparison of the light signals reflected and diffused by the object toward each of the two light receivers.

An advantageous embodiment of the device includes a set of directional single-point emitters in the vicinity of said particular area and a set of directional single-point receivers, each emitter being associated with at least two receivers so that the axes of those two receivers intersect the axis of the emitter at two different points, control means for energizing the light emitters successively, identification means for identifying the optimum emitter for which maximum light signals reflected and diffused by the object are received by at least one receiver, and processing means for determining the position of the object on the axis of the optimum emitter as a function of a comparison of the light signals reflected and diffused by the object toward the two light receivers associated with the optimum emitter.

In one variant of the invention, the device includes, in the vicinity of said particular area, at least two directional single-point emitters associated with at least one directional single-point light receiver covering the particular area, each light emitter and receiver having an axis substantially parallel to the particular area on which maximum emission, respectively maximum sensing angle, is observed, so that the axes of the emitters intersect the axis of the receiver at different points, control means for energizing the light emitters successively, and processing means for determining the position of the object on the axis of the receiver as a function of a comparison of the light signals reflected and diffused by the object toward the light receiver on the successive energizing of light emitters.

This variant of the device advantageously includes a set of directional single-point emitters in the vicinity of said particular area and a set of directional single-point receivers, each receiver being associated with at least two emitters so that the axes of those emitters intersect the axis of the receiver at different points, control means for energizing the light emitters successively, identification means for identifying the optimum receiver for which maximum light signals reflected and diffused by the object are received by that receiver on energizing at least one of the emitters, and processing means for determining the position of the object on the axis of the optimum receiver as a function of a comparison of the light signals reflected and diffused by the object toward the optimum receiver on the successive energizing of the associated emitters.

Devices of the invention can implement the particular features of the method described above.

In one particular embodiment of the invention, said particular area is an entry area and each of the elementary areas is a key.

The invention finally provides a data entry terminal including a device of the invention.

BRIEF DESCRIPTION OF THE DRAWINGS

Other features and advantages of the present invention emerge from the description given below with reference to the appended drawings, which show one non-limiting embodiment thereof. In the figures.

DETAILED DESCRIPTION OF ONE EMBODIMENT

Figure 1:
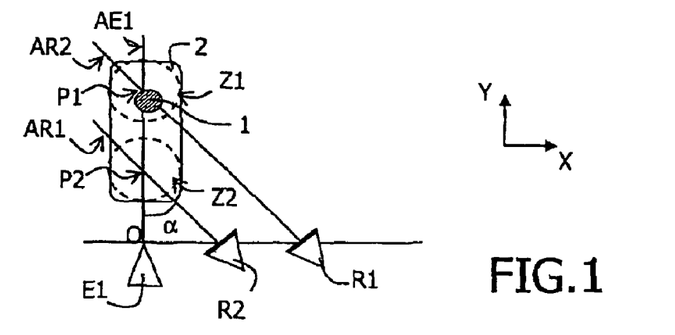
FIG. 1 is a diagram showing the operating principle of a device of the invention for optically determining the position of an object in a particular area of a surface.

FIG. 1 illustrates the principle of the invention. The aim of the invention is to determine the position of an object 1 in a particular area 2 of a surface. For this purpose, two directional single-point receivers R1 and R2 and a directional single-point emitter E1 are placed near the particular area 2, each having a respective maximum emission or maximum sensing angle axis AR1, AR2, AE1.

All three elements (emitter and two receivers) are advantageously placed in a plane parallel to the particular surface and are therefore all at substantially the same level relative to that area 2. Their maximum emission axis AE1 or maximum reception sensitivity axes AR1 and AR2 are therefore at grazing incidence to the particular area 2.

The term "single-point" means that each receiver or emitter comprises a single element or a plurality of elements providing as its output (consisting of a received signal for a receiver or of emitted light for an emitter) overall information applying to all of the plurality of elements. This means that this output information is not differentiated as a function of each element of the plurality of elements, as happens, in contrast, with position detectors comprising receivers disposed in the form of dials, strips, etc.

Figure 2:
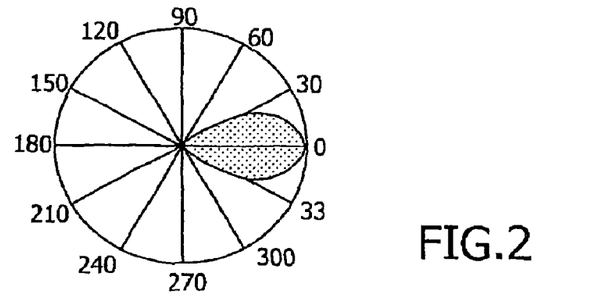
FIG. 2 is a diagram showing the sensing angle of receivers used in a method of the invention.

FIG. 2 is a diagram showing the sensing angle of the receivers. The aperture angle, i.e. the angle at which the sensitivity is halved, is equal to $\alpha_0=37°$ The maximum angle of incidence of rays captured is approximately 30°. The choice of the aperture angle for implementing the invention is important. It can be modified as a function of the application. However, if the sensing angle is wide it is difficult to distinguish between the different positions of the object 1 but if the sensing angle is too narrow, the object 1 can escape the fields of the receivers. The influence of the sensing angle is explained below.

The proposed curve can equally illustrate the emission profile. It is beneficial to collimate the power emitted on the axis of the emitter AE1 to maximize the quantity of light directed toward the object 1 and thus to enhance reflection by the object 1. However, the emission characteristics are less critical here than the characteristics of the receivers; what is essential is that the object 1 should receive sufficient light for sufficient light to be reflected toward the receivers R1 and R2.

Emitters and receivers having a maximum emission or maximum reception sensitivity axis are usually called directional emitters or receivers.

The receivers R1 and R2 and the emitter E1 are disposed so that their axes are substantially parallel to the surface 2 and the axes of the receivers R1 and R2 intersect the axis of the emitter E1 at different points P1 and P2. The axes AR1 and AR2 of the receivers are at an angle $\alpha$ to the axis AE1 of the emitter.

When the emitter E1 is energized, it produces a light beam with a certain aperture angle about its emission axis AE1. The object 1 reflects and diffuses some of this light.

Given the sensitivity and emission profiles of the receivers and the emitter, direct reflection of some of the emitted light by the object 1, for example a finger, means that the receiver R1 can collect a relatively large amount of light.

The receiver R2 also collects light reflected and diffused by the object 1.

S1 denotes the signal reflected by the object 1 and received by the receiver R1 and S2 denotes the signal reflected by the object 1 and received by the receiver R2.

If an object, for example a finger, is considered to reflect the emitted light uniformly, then to a first approximation:

$$S1 = \frac{K \cdot f\left(\tan^{-1}\left(\frac{Y}{X(R1)-X}\right) - \alpha\right)}{Y^2 + (X(R1)-X)^2}$$

$$S2 = \frac{K \cdot f\left(\tan^{-1}\left(\frac{Y}{X(R2)-X}\right) - \alpha\right)}{Y^2 + (X(R2)-X)^2}$$

where:

$$f(\theta) = \cos(c \cdot \theta) \text{ with } c = \frac{\cos^{-1}(1/2)}{\alpha_0} \text{ for } \theta \in \left[\frac{-\pi}{2c}, \frac{\pi}{2c}\right]$$

and $f(\theta) = 0$ elsewhere.

The invention compares the signals S1 and S2 to determine the position of the object 1.

This comparison advantageously relies on calculating a ratio between S1 and S2.

Figure 3:
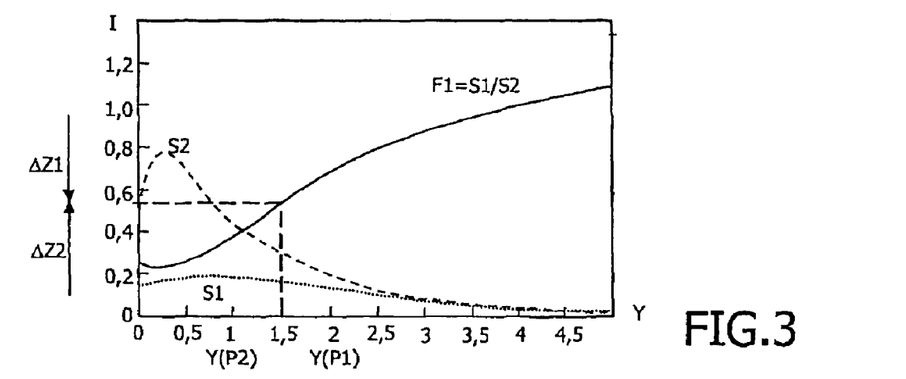
FIG. 3 shows curves of signals obtained at two receivers of an optical determination device as shown in FIG. 1 and a comparison of those signals as a function of the distance from the emitter.

FIG. 3 represents an example of curves of normalized intensity I for the signals S1, S2 and a curve for the ratio F1=S1/S2 as a function of the distance Y from which the object 1. The angle $\alpha$ is equal to 45°, X(R1) is equal to 2 and X(R2) is equal to 1. Thus Y(P1) is equal to 2 and Y(P2) is equal to 1. Furthermore, as the requirement is to know the position of the object 1 in one dimension, on the axis of the emitter passing through the origin O of the system of axes, X is taken as equal to zero.

It is found that the ratio F1 evolves significantly as a function of the distance Y. This variation is then used to determine the distance Y from the object 1.

The sensing angle of the receivers is an important parameter for obtaining a variation suitable for discerning distances. If the sensitivity or aperture angle of the receivers is increased, the curve obtained for the ratio F1 is flattened, making difficult a one-to-one relationship with the distance Y to the emitter. In contrast, too narrow a sensing angle generates "gaps" in the one-to-one relationship, in which it is not possible to associate a value with a distance Y. In this situation, a simple solution is to add more receivers by associating with each emitter a number N (N>2) of receivers close together and with a narrow sensing angle.

It is therefore clear that the sensing angle and the number of receivers used determine a smaller discernible unit distance. This determines the accuracy with which a position is determined.

Using a calibrated inverse function of the ratio F1 relative to the distance Y to obtain an absolute distance between the emitter and the object on the axis AE1 of the emitter E1 can be envisaged. The position of the object can then be determined to within a few millimeters.

It is often also of benefit to situate the object 1 on a grid or on a set of elementary areas, for example the circles Z1 and Z2 represented in dashed line in FIG. 1. As shown in FIG. 1, the particular area 2 can be a relatively large area surrounding the circles Z1 and Z2, but can equally chosen as the union of those circles, which are close vicinities of the points of intersection of the axes of the receivers and the emitters.

Position determination is then discrete and based on the use of a table including ranges of calibrated minimum and maximum thresholds $\Delta Z1$ and $\Delta Z2$ for the value of the ratio F1; associating these ranges of thresholds with each elementary zone, here Z1 and Z2, is then advantageous.

Figure 4:
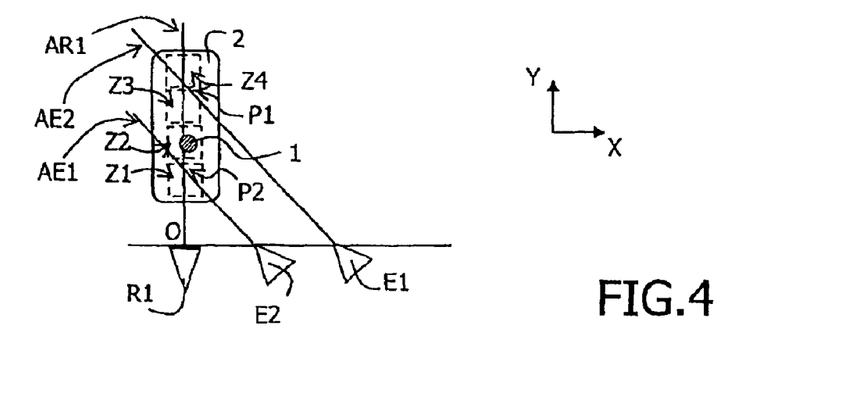
FIG. 4 is a diagram showing a variant of the operating principle of a device of the invention.

FIG. 4 illustrates a variant of the invention in which two emitters E1 and E2 are used in association with the same receiver R1. The axes AE1 and AE2 of the emitters E1 and E2 intersect the axis of the receiver R1 at two different points.

In such a variant, the emitters E1 and E2 are energized successively and the reflection generated by an object 1 placed on a surface 2 is evaluated from signals S1 and S2 received by the receiver R1 at the times the emitters E1 and E2 are energized. The illumination frequency is conventionally chosen at between 20 and 200 illuminations per second.

In this embodiment, applying the principle of the invention entails comparing the signals S1 and S2, advantageously by calculating a ratio between the two signals, to determine the distance Y at which the object 1 is situated on the axis AR1 of the receiver R1.

In FIG. 4, the particular area 2 is divided into four elementary areas represented by dashed line squares Z1, Z2, Z3, and Z4. Here the particular area is the vicinity of a segment joining the points of intersection of the axes of the receivers with that of the emitter. A table of four ranges of thresholds corresponding to each of these elementary areas is used here to locate the object 1 in one of the elementary areas Z1 to Z4.

Because of the amount of signal reflected in practice and inaccuracies in positioning the receivers and in the measurements themselves, reliable information is primarily obtained in a segment between the two points P1 and P2 of the examples given above and in the surrounding area. This advantageously defines the particular area 2.

For example, in FIG. 1, if the object 1 is too close to the emitter E1, it is no longer possible to obtain reliable information on the distance Y since, for Y<1, the curve S1/S2 is not bijective. If the object 1 is too far away, the amount of signal is too small to be significant, the curve S1/S2 no longer having sufficient slope.

Figure 5:
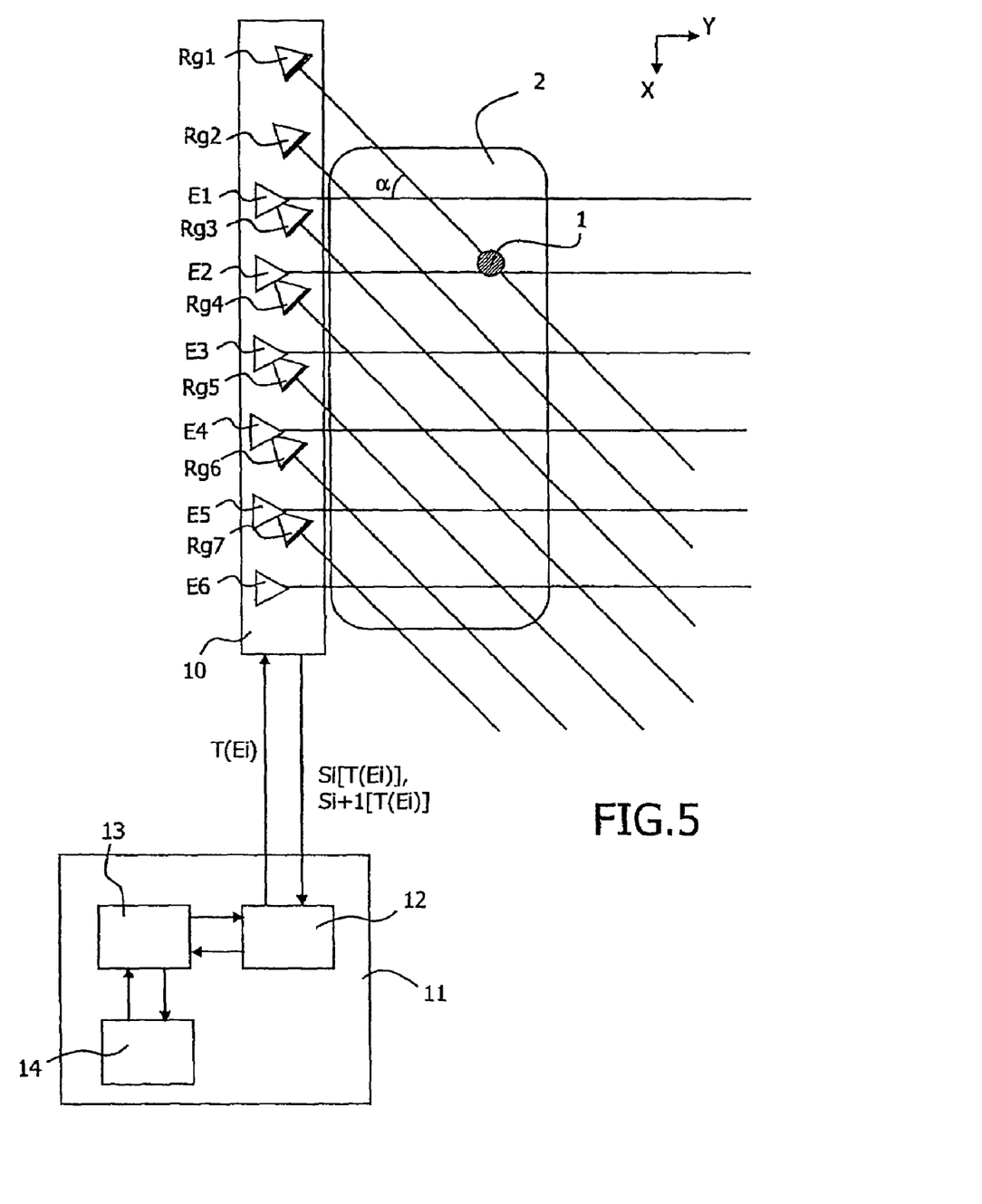
FIG. 5 represents one embodiment of the invention.

FIG. 5 represents one embodiment of a device of the invention in which, using the same principle as in FIG. 1, the numbers of emitters and receivers have been increased, but still with two receivers for each emitter.

A particular area 2 on which the position of an object can be determined is then available. That area 2 is considerably enlarged compared to that obtained with only one emitter and two receivers. What is more, it can be seen that the position of an object in two dimensions can now be determined.

This embodiment uses N light emitters E1 to EN. In the FIG. 5 example, N is equal to 6.

It also uses N+1 receivers Rg1 to RgN+1.

The receivers Rg1 to RgN+1 and the emitters E1 to EN are advantageously disposed on the same side of the particular area 2 in two substantially parallel, here separate, rows, and are advantageously carried by the same hardware structure. Note that the two rows respectively comprising the receivers and the emitters can instead coincide. The two rows are always substantially parallel but can be straight or slightly curved, defining what is referred to as one side of the particular area 2.

The object 1 being detected primarily by the light diffused by the object 1, the two receivers associated with an emitter, and more generally the emitters and the receivers, are advantageously situated on the same "side" of the object 1. The object generally diffuses light into a half-space delimited by a half-plane perpendicular to the axis of the emitter and passing through the object. The best way to achieve this is to place emitters and receivers on the same side of the particular area in which the position of the object can be determined.

In the FIG. 5 embodiment, they are disposed substantially in the same row on a strip 10 supporting them. The axes of the receivers are at an angle $\alpha$ to the axes of the emitters.

The receivers Rgi and Rgi+1, where i=1 to N, are "associated" with the emitter Ei. Note that, with the exception of the receivers at the ends, the same receiver is generally associated with two emitters. This saves on hardware for implementing the invention compared to the basic embodiment of FIG. 1.

The strip is provided with an interface for connecting the receivers and emitters that it supports to a control module 11 including a microprocessor-based control unit 13 and at least an analog/digital converter 12.

Grouping the components on the same strip 10 prevents ageing phenomena that can lead to relative movement of the emitters Ei and the receivers Rgi if these groups of elements are carried by separate hardware structures, which can therefore move relative to each other. What is more, this is less costly and reduces the connection hardware.

Note further that the emitters Ei and the receivers Rgi then alternate to enable association of an emitter with two receivers and to use the same receiver in association with one or more emitters.

As shown in FIG. 5, the emitters Ei and the receivers Rgi advantageously alternate to grid the positions of the object with substantially the same resolution characteristics in the two directions X and Y. The term "resolution" here denotes the minimum distance between two detectable positions.

The microprocessor of the control unit 13 includes a program for controlling the operation of the emitters and receivers of the strip 10 via the converter 12. In particular, this program commands turning the emitters Ei on and off at particular times T(Ei) and measurement of the signals Si[T(Ei)] and Si+1[T(Ei)] at each of the receivers Rgi and Rgi+1 associated with the emitter Ei.

It can be beneficial to provide the control module 11 with a multiplexer between the converter or converters 12 and the interface with the strip 10, in order to be able to measure the signals at the receivers in any order.

The data produced by converting the signals received by the receivers is advantageously stored in a storage unit 14, for example an EEPROM, under the control of the control unit 13.

Figure 6:
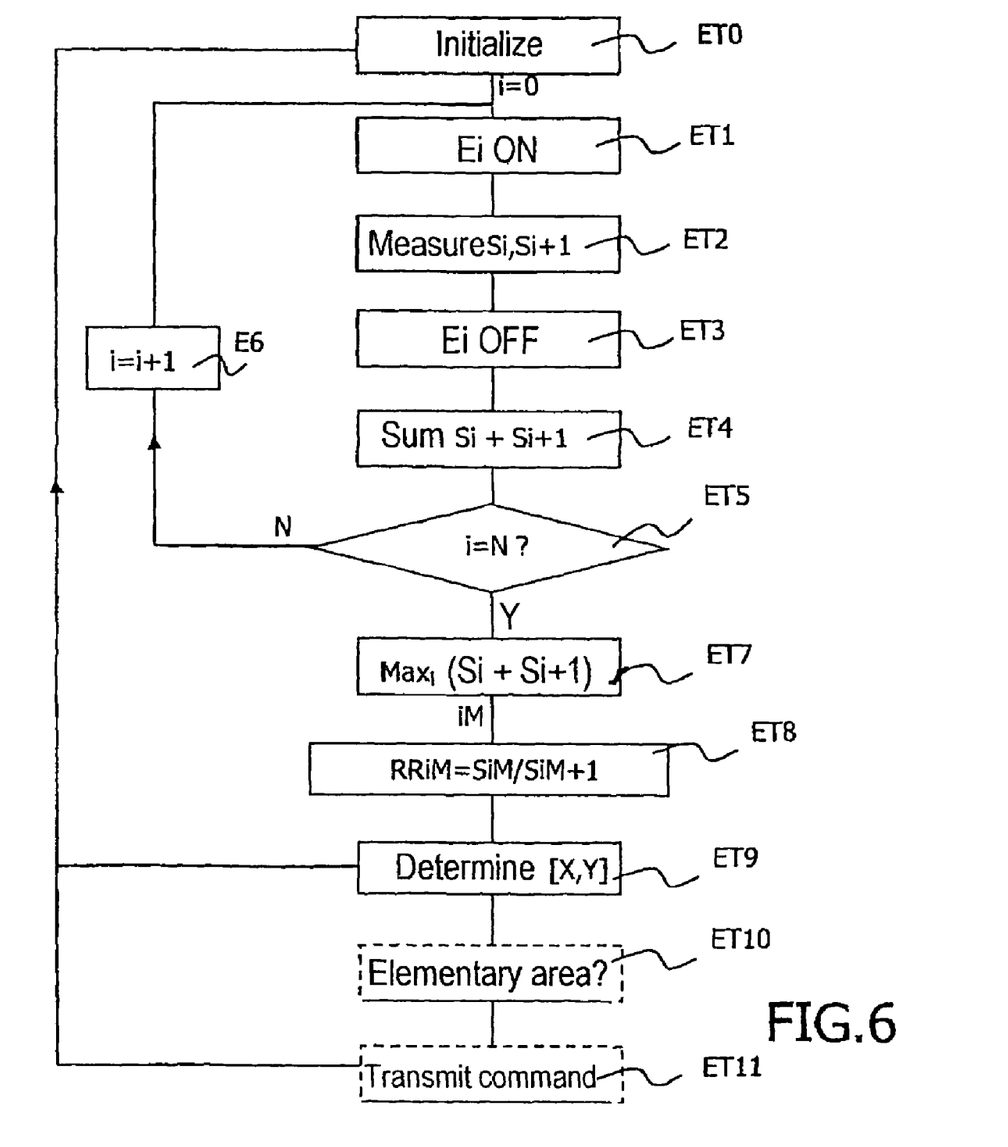
FIG. 6 is a flowchart showing the principle of determining the position of an object using the device shown in FIG. 5.

FIG. 6 is a flowchart illustrating the sequence of instructions programmed in the control unit 13 for turning the emitters Ei on and off and commanding measurements at the associated receivers Ri, Ri+1. Before any measurement is carried out, a device of the invention must be calibrated, for example by establishing a table of ranges of thresholds for each emitter, each matched to an elementary area facing that emitter in the particular area.

Before any measurement is carried out, it is advantageous to carry out an initialization step ET0. This entails in particular setting the value of i to an initial value, for example the value 0.

In the step ET1, an emitter is energized. The signals Si and Si+1 at the associated receivers Ri and Ri+1 are measured in the step ET2.

The emitter Ei is turned off in the step ET3. The sum of the two signals Si and Si+1 is calculated in the step E4.

A test is carried out in the step ET5 to determine if i is equal to N. If not, i is incremented in a step ET6 in order for the steps ET1 to ET4 to be repeated for each emitter Ei.

If i is equal to N, there follows the step ET7 in which it is determined for which emitter Ei a maximum sum of the signals Si and Si+1 is obtained. That emitter is then referred to as the optimum emitter EiM.

The ratio of the signals FiM=SIM/SIM+1 is then calculated for this optimum emitter in the step ET8.

The position X, Y of the object 1 is then determined in the step ET9.

To determine the X axis coordinate, it can be sufficient to use the value of iM for the maximum sum of the signals received from the emitter Ei. The X coordinate of the object is then considered equal to the coordinate of the emitter EiM.

Otherwise, it is advantageous to calculate the mean value M of the positions of the emitters weighted by the previously calculated sum of the signals received, in other words:

$$M = \frac{\sum_{i=1}^{N} i \cdot (Si + Si + 1)}{\sum_{i=1}^{N} Si + Si + 1}$$

This mean value gives a more precise value of the coordinate X and can in particular be used to decide when signal sums close to a maximum are obtained for two adjacent emitters.

According to the invention, the value of the ratio FiM gives the value of Y by giving the distance Y of the object 1 from the row of emitters Ei, calculated by adopting the approximation that the object is facing the emitter Ei.

If the position of the object 1 is to be determined in a set of elementary areas, then an elementary area, for example a key, is associated with the position of the object in the step ET10 and a command is transmitted in the step ET11, for example. There is then a loop to the step ET0.

In the embodiment of the invention shown in FIG. 4, the optimum receiver is advantageously that with the maximum sum of the signals received successively on the successive energizing of the associated two emitters. A flowchart of the FIG. 6 type but showing the operation of this embodiment of the invention would show that when each emitter is energized, except for the emitters at the ends, two receivers are activated to measure the received signals. Adopting the notation R1 to R6 for the receivers that have replaced the emitters E1 to E6 in FIG. 5 and Eg1 to Eg7 for the associated emitters that have replaced the receivers Rg1 to Rg7, when an emitter Egi is energized, the receivers Ri and Ri+1 are activated to produce one of the two measurements necessary for implementing the invention at each receiver. Energizing the next emitter Egi+1 then serves to calculate the Y position facing the receiver Ri, which also carries out a measurement during this energizing. To determine the Y position, the ratio Si/Si+1 between the signals received by the receiver Ri on the successive energizing of the emitters Egi and Egi+1 is then calculated.

Figure 7:
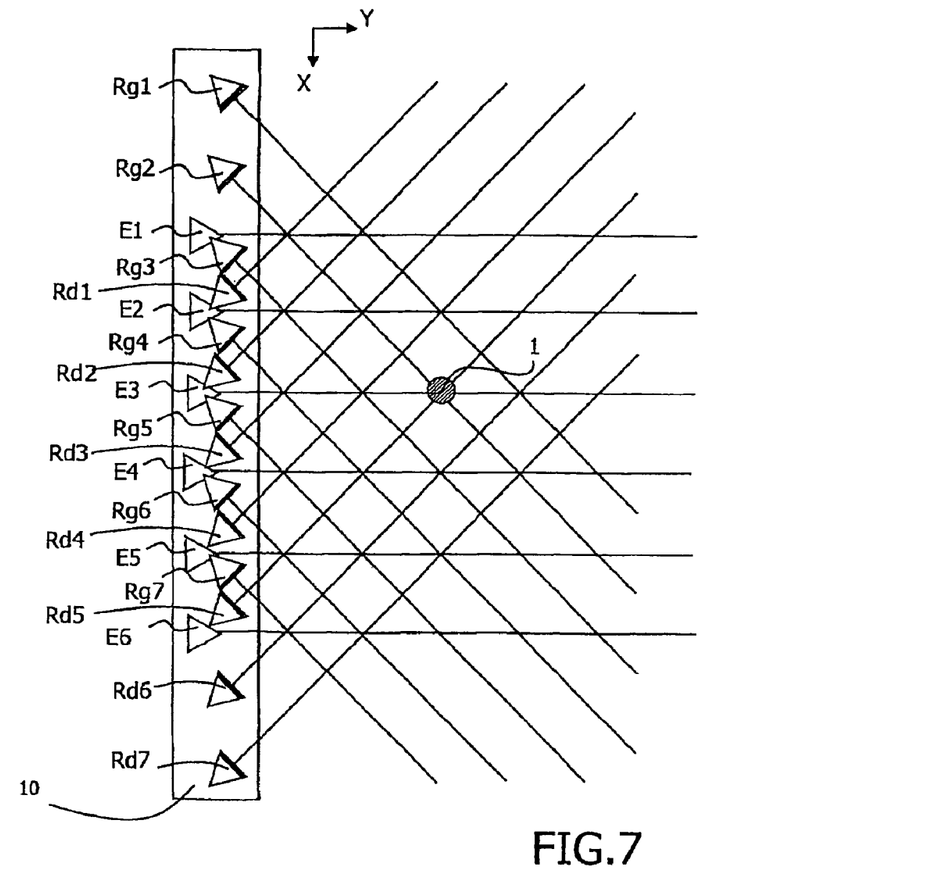
FIG. 7 represents an advantageous embodiment of the invention.

FIG. 7 represents a preferred embodiment of the invention in which the amount of light received is maximized and the effects of non-constant angular reflection from the object 1 as a function of the angle are compensated. The receivers Rgi are duplicated symmetrically relative to each axis of an emitter Ei by receivers Rdi. The receivers Rgi and Rdi then receive twice as much light, from "both sides" of the reflection. Given the geometry of the device, a first signal Si is then the sum of the signal received by the receiver Rgi and the signal received by the receiver Rdi+1 and a second signal Si+1 is the sum of the signal received by the receiver Rgi+1 and the signal received by the receiver Rdi. The invention uses the ratio between the signals Si and Si+1 to determine the distance Y to an object 1. This embodiment improves accuracy and sensitivity.

Figure 8:
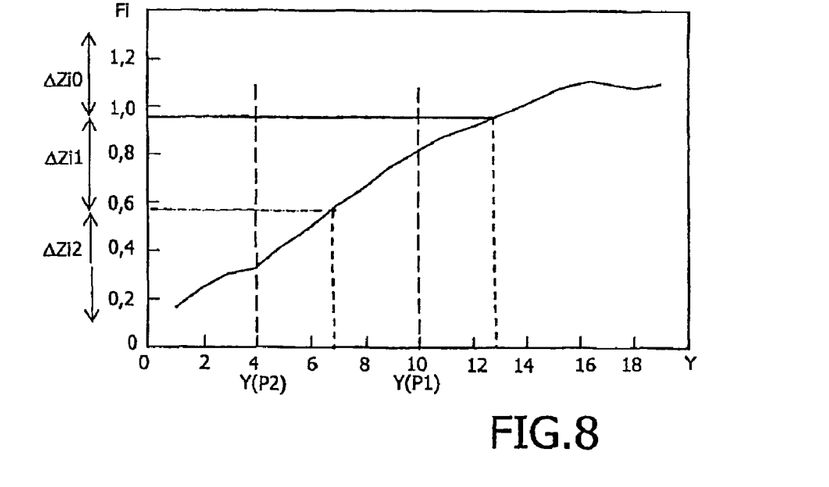
FIG. 8 represents the variations as a function of the distance from an emitter on the axis of that emitter of signals reflected and diffused by the object and received by each of the two receivers associated with that emitter and of a calculated ratio between the signals reflected and diffused toward the associated two receivers.

FIG. 8 is a curve obtained for the ratio Si/Si+1 as a function of the distance Y to the row of emitters Ei on the strip 10 of the FIG. 7 device with an angle equal to 45°. This curve is obtained with receivers having a sensing angle close to that of the receivers used in FIG. 3, for example Vishay TEKT5400 infrared light receiver phototransistors. The emitters used are OSRAM HDSL4230 infrared light emitter diodes.

Note that the curve has an overall slope that is sufficient for calculating an absolute distance Y of up to approximately 14 distance units, each such unit being 2.5 mm.

Figure 9:
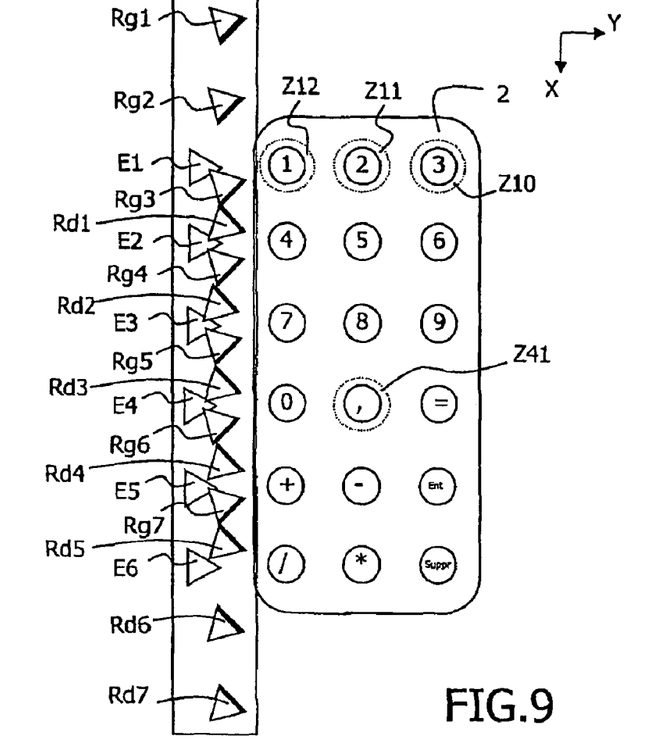
FIG. 9 is an illustration of a keypad produced in accordance with the invention on any surface.

FIG. 9 shows an embodiment of a keyboard based on the FIG. 7 embodiment. The particular area 2 facing each of the emitters Ei includes engraved keys. For example, the keys represented here are centered at points located 10, 25, and 40 mm from the strip 10. They define elementary areas Zik, k=0 to 2, for example Z12, Z11, Z10 and Z41 in the figure, facing each emitter Ei and covering the engraved key. Each key Zik is advantageously associated with a given function, and so any position of the object 1 in an elementary area Zik activates the function associated with that elementary area Zik.

This kind of keyboard can be for an entry terminal for manual data entry in computers, fixed or mobile telephones, PDA or any other electronic device.

FIG. 8 represents a set of ranges of thresholds ΔZi0 to ΔZi2. They correspond to the elementary areas defined by the keys facing each emitter Ei and are therefore used to determine the Y position of the object 1 in one of the elementary areas Zi0 to Zi2 each four length units on the axis of each emitter Ei and separated by two distance units.

Finally, note that the invention is not limited to the embodiments described here and that there are various alternative embodiments of the invention according to the following claims.

In particular, although the determination of a optimum emitter is described as using the associated receivers to find a maximum received signal, in some circumstances using the same receiver for the successive energizing of all the emitters or, with a particular configuration, all receiver(s) or a receiver other than the associated receivers can be envisaged without departing from the scope of the claims.

Similarly, the association between receivers and emitters for calculating the distance from the emitter can vary provided that the axes of at least two associated receivers intersect the axis of an emitter at two different points.

The invention using a greater number of elements associated with another element, for example three receivers to one emitter, can also be envisaged, the axes of the three receivers intersecting the axis of the emitter at different points. Comparisons between the signals are then effected by calculating various ratios between the signals, for example, with the values of those ratios calibrated beforehand as a function of the distance from the object.

Figure 10:
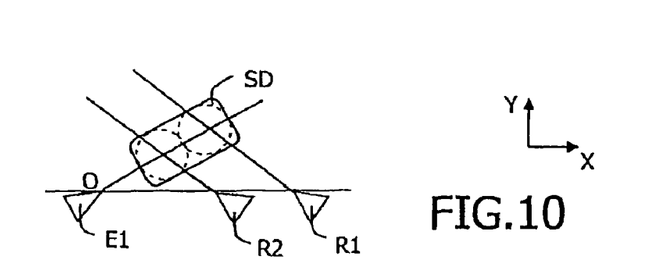
FIG. 10 shows the principle of one particular embodiment of the invention.
Figure 11:
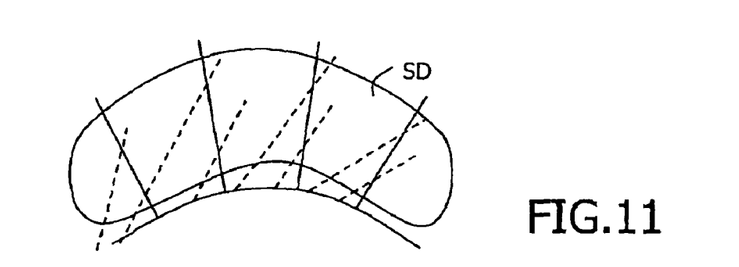
FIG. 11 is a diagram showing an application of the invention to one particular surface.

Furthermore, FIGS. 10 and 11 show embodiments of the invention that can be used in various situations.

Accordingly, in FIG. 10 in particular, the angles between the emitter and the receivers and a row in which they are placed can vary without departing from the scope of the invention. The angle can also vary as a function of the application.

FIG. 11 shows an embodiment of the invention in which the receivers and the emitters are placed on a curved line.

What is claimed is:

1. A method of optically determining the position of an object in a particular area of a substantially plane surface, including the following steps:

disposing in the vicinity of said particular area at least one directional single-point emitter associated with at least two directional single-point light receivers covering the particular area, each light emitter and receiver having an axis substantially parallel to the particular area on which maximum emission, respectively maximum sensing angle, is observed, so that the axes of the receivers intersect the axis of the emitter at different points;

energizing the light emitter;

determining the position of the object on the axis of the emitter as a function of a comparison of the light signals reflected and diffused by the object toward each of the two light receivers.

2. A method according to claim 1, wherein the comparison consists in calculating a ratio between the light signals received by each of the receivers when the associated emitter is energized.

3. A method according to claim 1, including the following steps:
disposing a set of emitters in the vicinity of said particular area and a set of receivers, each emitter being associated with at least two receivers so that the axes of those receivers intersect the axis of the emitter at different points;
energizing the light emitters successively;
identifying the optimum emitter for which maximum light signals reflected and diffused by the object are received by at least one receiver;
determining the position of the object on the axis of the optimum emitter as a function of a comparison of the light signals reflected and diffused by the object toward the two light receivers associated with the optimum emitter.

4. A method according to claim 3, wherein the receiver for identifying the optimum emitter is chosen as a function of the emitter concerned.

5. A method according to claim 4, wherein the receiver for identifying the optimum emitter is a receiver associated with the emitter concerned.

6. A method according to claim 1, including the step of doubling the number of receivers and disposing them symmetrically relative to the axes of the emitters.

7. A method according to claim 1, wherein the number of receivers and/or the sensing angle of the receivers is adapted to obtain a chosen position measurement accuracy.

8. A method according to claim 1, wherein emitter and receivers are disposed in a single row.

9. A method according to claim 1, wherein the emitter or each emitter emits non-coherent light.

10. A method according to claim 9, wherein the wavelength of the emitted light is chosen in one of the following ranges of wavelengths: UV, visible and infrared.

11. A method according to claim 1, wherein the particular area is defined by a set of vicinities of points of intersection of the axes.

12. A method according to claim 1, wherein the particular area includes a set of elementary areas each associated with a given function so that any position of the object in an elementary area activates the function associated with that elementary area.

13. A method of optically determining the position of an object in a particular areas of a substantially plane surface, including the following steps:
disposing in the vicinity of said particular area at least two directional single-point emitters associated with one directional single-point light receiver covering the particular area, each light emitter and receiver having an axis substantially parallel to the particular area in which maximum emission, respectively maximum sensing angle, is observed, so that the axes of the emitters intersect the axis of the receiver at different points;
energizing the light emitters successively;
determining the position of the object on the axis of the receiver as a function of a comparison of the light signals reflected and diffused by the object toward the light receiver on the successive energizing of the emitters.

14. A method according to claim 13, wherein the comparison consists in calculating a ratio between the light signals received by the receiver on the successive energizing of the associated emitters.

15. A method according to claim 13, including the following steps:
disposing a set of emitters in the vicinity of said particular area and a set of receivers, each receiver being associated with at least two emitters so that the axes of those emitters intersect the axis of the receiver at different points;
energizing the light emitters successively;
identifying the optimum receiver for which maximum light signals reflected and diffused by the object are received by that receiver on energizing at least one of the emitters;
determining the position of the object on the axis of the optimum receiver as a function of a comparison of the light signals reflected and diffused by the object toward the optimum receiver on the successive energizing of the associated emitters.

16. A method according to claim 15, wherein the emitter for identifying the optimum receiver is chosen as a function of the receiver concerned.

17. A method according to claim 16, wherein the emitter for identifying the optimum receiver is an emitter associated with the receiver concerned.

18. A method according to claim 13, including the step of doubling the number of emitters and disposing them symmetrically relative to the axes of the receivers.

19. An optical device for determining the position of an object in a particular area of a substantially plane surface, including:
in the vicinity of said particular area, at least one directional single-point emitter associated with at least two directional single-point light receivers covering the particular area, each light emitter and receiver having an axis substantially parallel to the particular area on which maximum emission, respectively maximum sensing angle, is observed, so that the axes of the receivers intersect the axis of the emitter at different points;
control means for energizing the light emitter;
processing means for determining the position of the object on the axis of the emitter as a function of a comparison of the light signals reflected and diffused by the object toward each of the two light receivers.

20. A device according to claim 19, including:
a set of emitters in the vicinity of said particular area and a set of receivers, each emitter being associated with at least two receivers so that the axes of those two receivers intersect the axis of the emitter at two different points;
control means for energizing the light emitters successively;
identification means for identifying the optimum emitter for which maximum light signals reflected and diffused by the object are received by at least one receiver;
processing means for determining the position of the object on the axis of the optimum emitter as a function of a comparison of the light signals reflected and diffused by the object toward the two light receivers associated with the optimum emitter.

21. A device according to claim 19, wherein emitter and receivers are disposed in a single row.

22. A device according to claim 19, wherein the particular area is defined by a set of vicinities of points of intersection of the axes.

23. A device according to claim 19, wherein the particular area includes a set of elementary areas each associated with a given function so that any position of the object in an elementary area activates the function associated with that elementary area.

24. A device according to claim 23, wherein said particular area is an entry area and each of the elementary areas is a key.

25. A device according to claim 19, wherein the emitter emits non-coherent light.

26. A device according to claim 25, wherein the wavelength of the emitted light is in one of the following ranges of wavelengths: UV, visible and infrared.

27. A data entry terminal including a device according to claim 19.

28. A device for optically determining the position of an object in a particular area of a substantially plane surface, including:
  in the vicinity of said particular area, at least two directional single-point emitters associated with at least one directional single-point light receiver covering the particular area, each light emitter and receiver having an axis substantially parallel to the particular area on which maximum emission, respectively maximum sensing angle, is observed, so that the axes of the emitters intersect the axis of the receiver at different points;
  control means for energizing the light emitters successively;
  processing means for determining the position of the object on the axis of the receiver as a function of a comparison of the light signals reflected and diffused by the object toward the light receiver on the successive energizing of light emitters.

29. A device according to claim 28, including:
  a set of emitters in the vicinity of said particular area and a set of receivers, each receiver being associated with at least two emitters so that the axes of those emitters intersect the axis of the receiver at different points;
  control means for energizing the light emitters successively;
  identification means for identifying the optimum receiver for which maximum light signals reflected and diffused by the object are received by that receiver on energizing at least one of the emitters;
  processing means for determining the position of the object on the axis of the optimum receiver as a function of a comparison of the light signals reflected and diffused by the object toward the optimum receiver on the successive energizing of the associated emitters.

* * * * *